United States Patent [19]
Botti et al.

[11] Patent Number: 5,216,381
[45] Date of Patent: Jun. 1, 1993

[54] UNITARY-GAIN FINAL STAGE PARTICULARLY FOR MONOLITHICALLY INTEGRATABLE POWER AMPLIFIERS

[75] Inventors: Edoardo Botti, Vigevano; Guido Brasca, Varese, both of Italy

[73] Assignee: SGS-Thomson Microelectronics S.r.l., Milan, Italy

[21] Appl. No.: 808,498

[22] Filed: Dec. 17, 1991

[30] Foreign Application Priority Data

Dec. 20, 1990 [IT] Italy ............... 22449 A/90

[51] Int. Cl.$^5$ .............................................. H03F 3/45
[52] U.S. Cl. .................................... 330/253; 330/260
[58] Field of Search ............... 330/253, 255, 260, 269, 330/273, 274

[56] References Cited

U.S. PATENT DOCUMENTS

| | | |
|---|---|---|
| 3,987,369 | 10/1976 | Yokoyama. |
| 4,241,313 | 12/1980 | Takehara ........................... 330/253 |
| 4,370,623 | 1/1983 | Nagasawa ........................... 330/267 |

FOREIGN PATENT DOCUMENTS

| | | |
|---|---|---|
| 3032675A1 | 3/1981 | Fed. Rep. of Germany. |
| 3523426 | 1/1987 | Fed. Rep. of Germany. |
| 2180710A | 3/1987 | United Kingdom. |

OTHER PUBLICATIONS

Calzolari et al, "Integrated NMOS Output State With Low Output Impedance," *Electronics Letters*, vol. 17, No. 6, Mar. 19, 1981, pp. 218–220.

Patent Abstracts of Japan vol. 6, No. 42 Mar. 16, 1982.
Electronics World and Wireless World (GB) vol. 96, No. 1655 Sep. 1990 pp. 760–764.
IEEE Transact. On Consumer Electronics vol. CE-28, No. 4, Nov. 1982 pp. 546–552.

*Primary Examiner*—James B. Mullins
*Attorney, Agent, or Firm*—Townsend and Townsend Khourie and Crew

[57] ABSTRACT

Unitary-gain final stage particularly for monolithically integratable power amplifiers, which comprises a pair of final N-channel MOS power transistors. The first transistor has its drain terminal connected to a supply voltage and its source terminal connected to the drain terminal of the second transistor. The source terminal of the second transistor is connected to the ground. The output terminal of the power amplifier is connected between the source terminal of the first transistor and the drain terminal of the second transistor. The final stage furthermore comprises a high-gain feedback differential amplifier which has its non-inverting input terminal connected to the input of the power amplifier, its inverting input terminal connected to the output terminal of the differential amplifier and its output terminal connected to the gate terminal of the second transistor. A leveling circuit is furthermore connected to the gate terminal of the second transistor. A third MOS transistor has its source terminal connected to the input of the amplifier, and its gate terminal and drain terminal are connected to the gate terminal of the first transistor and to a first driven current source.

14 Claims, 2 Drawing Sheets

UNITARY-GAIN FINAL STAGE PARTICULARLY FOR MONOLITHICALLY INTEGRATABLE POWER AMPLIFIERS

BACKGROUND OF THE INVENTION

The present invention relates to a unitary-gain final stage particularly for monolithically integratable power amplifiers which use class AB-driven N-channel MOS transistors as power devices.

The technical problem of power amplifiers which use class AB-driven N-channel MOS transistors essentially relates to the effective control of the bias current in the final devices and to the reduction of crossover distortion.

The need to control the bias current arises from the compromise between the need to limit power dissipation, which requires a low bias current Iq, and the need to minimize crossover distortion due to the non-linearity of the final devices, which can be observed in the low-bias regions.

Another cause of crossover distortion resides, as is well-known, in the phenomenon of the complete switching off of alternatively one or the other of the final devices during a complete cycle of the output signal and in the switching-on delays which consequently arise therefrom, especially for very high frequencies.

The literature reports some examples of bias current control; the article by B. Roehr, "A simple direct-coupled power mosfet audio amplifier topology featuring bias stabilization", published in *IEEE Transactions on Consumer Electronics*, Vol. CE-28, No. 4, November 1982, pages 546-552, hereinafter referenced as [1], and the article "Une autre conception de l,amplificateur de puissance", published in the Siliconix catalog, AN80-5, pages 75-79, hereinafter referenced as [2], are particularly significant.

Article [1] describes a power amplifier in which the bias current in the final power devices is controlled by means of a complicated system for detecting the bias current $I_q$ which is based on a limiting circuit and on a subsequent filtration, with the use, among other things, of an operational amplifier and of a high-value capacitor. The capacitor used has a value two orders of magnitude higher than the other capacitors used in the circuit illustrated in [1] on page 550.

The amplifier circuit described in [2] is essentially the same as the preceding one, but the circuit for detecting the bias current $I_q$ is not present. Control of the bias current $I_q$ is entrusted, in this last circuit, to a potentiometer which is illustrated in the diagram on page 78 of [2].

The two proposed solutions, and in particular both the high-capacitance capacitor and the potentiometer, are not suitable for being manufactured in integrated form.

Furthermore, as illustrated on page 79 of [2], the circuit for driving the gate terminals of the final power transistors poses the problem of having PNP transistors with high current capacity. These transistors, in the particular perspective of monolithic integration, consume useful area, and it is convenient to limit their number.

SUMMARY OF THE INVENTION

The aim of the present invention is to eliminate or substantially reduce the disadvantages described above in known types of amplifier circuits by providing a unitary-gain final stage, particularly for monolithically integratable power amplifiers, which minimizes crossover distortion regardless of its origin.

Within the scope of this aim, an object of the present invention is to provide a final stage which eliminates the use of non-integratable components, such as high-capacitance capacitors, potentiometers and the like.

Another object of the present invention is to provide a final stage which effectively controls the bias current in the final power transistors.

Not the least object of the present invention is to provide a unitary-gain final stage particularly for monolithically integratable power amplifiers which is relatively easy to manufacture and at competitive costs.

This aim, the objects mentioned and others which will become apparent hereinafter are achieved by a unitary-gain final stage particularly for monolithically integratable power amplifiers, according to the invention, which comprises a pair of final N-channel MOS power transistors, the first transistor having its drain terminal connected to a supply voltage, its source terminal connected to the drain terminal of the second transistor, whose source terminal is connected to the ground, the output terminal of the power amplifier being connected between said source terminal of said first transistor and said drain terminal of said second transistor, characterized in that the stage comprises a high-gain feedback differential amplifier which has its inverting input terminal connected to the input of said stage its inverting input terminal connected to the output terminal of said amplifier and its output terminal connected to the gate terminal of said second transistor, a leveling circuit being connected to the gate terminal of said second transistor, said leveling circuit being suitable for controlling said second transistor, a third MOS transistor being provided and having its source terminal connected to the input of the amplifier, the gate terminal and drain terminal of said third MOS transistor being connected to the gate terminal of said first transistor and to a first driven current source.

BRIEF DESCRIPTION OF THE DRAWINGS

Further characteristics and advantages of the invention will become apparent from the description of some preferred but not exclusive embodiments of a unitary-gain final stage particularly for monolithically integratable power amplifiers according to the invention, illustrated only by way of non-limitative example in the accompanying drawings, wherein.

DESCRIPTION OF THE PREFERRED EMBODIMENTS

Figure 1:
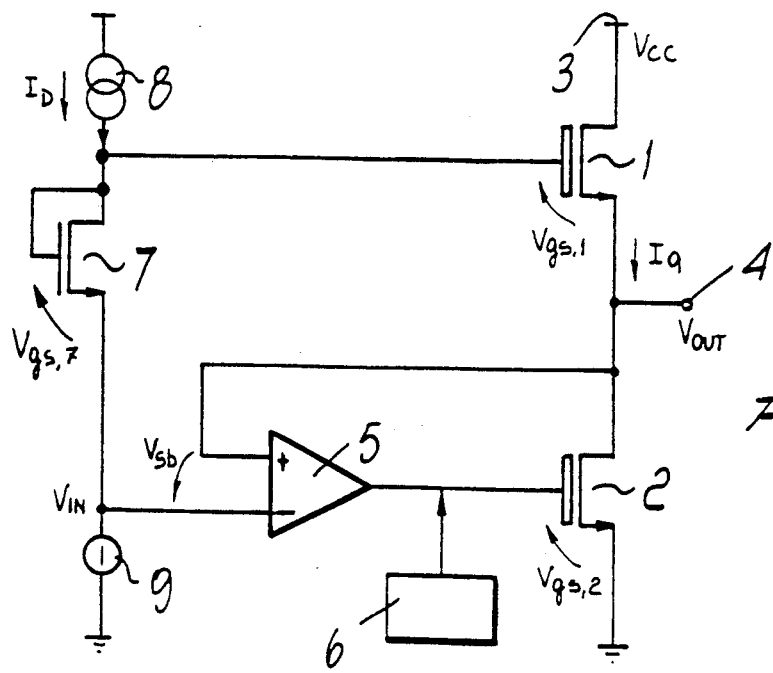
FIG. 1 is a diagram of a power amplifier equipped with a final stage according to the invention.

With reference to FIG. 1, a unitary-gain final stage according to the invention comprises a pair of final N-channel MOS power transistors 1 and 2. The first transistor 1 has its drain terminal connected to a supply voltage 3 and its source terminal connected to the drain terminal of the second transistor 2. The source terminal of the second transistor 2 is connected to the ground. The output terminal 4 of the power amplifier is connected between the source terminal of the first transistor 1 and the drain terminal of the second transistor 2.

The invention furthermore comprises a high-gain feedback differential amplifier 5 whose inverting input terminal is connected to the input of the power amplifier. The non-inverting input terminal of the differential amplifier 5 is connected to the output terminal 4 of the amplifier, and the output terminal of said differential amplifier 5 is connected to the gate terminal of the second transistor 2. A leveling circuit 6 is furthermore connected to the gate terminal of the second transistor 2, as more clearly explained hereinafter. A third MOS transistor 7 is provided and has its source terminal connected to the input of the power amplifier; the gate terminal and the drain terminal of the third MOS transistor 7 are connected to the gate terminal of the first transistor 1 and to a first driven current source 8.

In idle conditions, the feedback loop constituted by the differential amplifier 5 and by the second transistor 2 keeps the input voltage $V_{in}$, indicated in the figure by a voltage source 9, equal to the output voltage $V_{out}$ at the terminal 4. The gate-source voltage of the third transistor 7, $V_{gs,7}$, is thus equal to the gate-source voltage of the first transistor 1, $V_{gs,1}$, i.e. $V_{gs,7} = V_{gs,1}$, and thus the current $I_q$ which flows in the two transistors 1 and 2 is equal to:

$$I_q = [(W/L),1/(W/L),7] * I_D$$

where W and L respectively represent the channel width and length of the MOS transistors, and thus (W/L),1 and (W/L),7 are the width/length ratios respectively for the first transistor 1 and for the third transistor 7, whereas $I_D$ is the current generated by the first source 8.

By appropriately choosing the current $I_D$ and the ratio (W/L),7, it is evident that it is possible to control the bias current $I_q$ with a precision which depends on the matching of the area ratio and on the offset between the inverting input and the non-inverting input of the differential amplifier 5. This precision can in any case be kept high.

The present invention advantageously solves the above described problem of crossover distortion, keeping the two transistors 1 and 2 on the conduction threshold even on the half-cycle of the output signal during which they would normally be off.

This result is obtained, on the negative half-wave, by virtue of the particular topology of the circuit. When the second transistor 2 is conducting intensely, the difference between input and output, $V_{IN} - V_{OUT}$, which is equal to the voltage $V_{sb}$ present across the non-inverting input and the inverting input of the differential amplifier 5, is in fact limited to the imbalance between the inverting and non-inverting inputs of the differential amplifier 5 which is necessary in order to raise the output signal of the differential amplifier 5 to a high value. Thus $V_{gs,1} = V_{gs,7} - V_{sb}$.

It is evident that the voltage $V_{gs,1}$ differs from the idle value $V_{gs,7}$ by the amount $V_{sb}$, which is small, and that said voltage $V_{gs,1}$ is in any case always non-zero.

On the positive half-wave, the differential amplifier 5 is instead fully imbalanced and tends to lower the gate-source voltage $V_{gs,2}$ of the second transistor 2 to zero. In this case, the block indicated by the leveling circuit 6 intervenes and acts so that, as better explained hereinafter, the voltage $V_{gs,2}$ is kept at an appropriate value which is slightly lower than the idle value.

Figure 2:
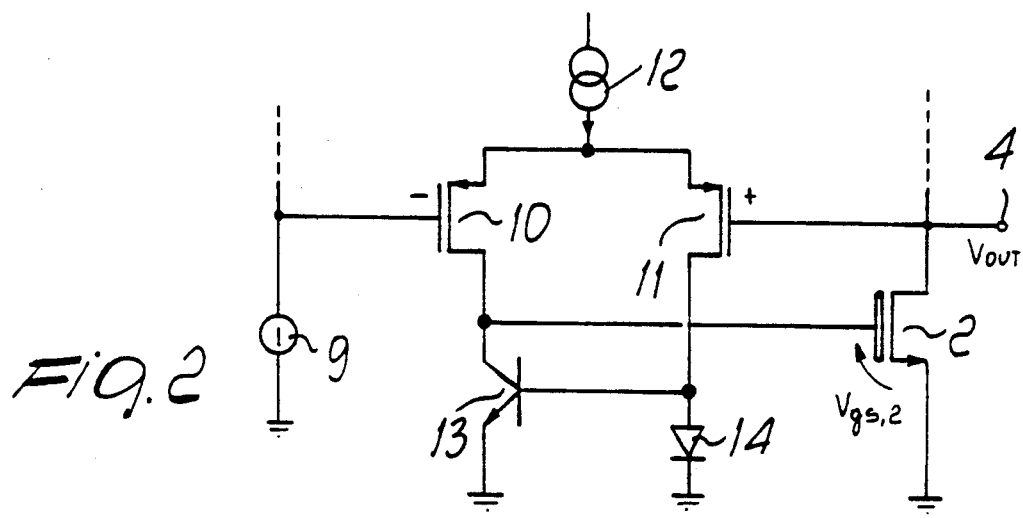
FIG. 2 is a diagram of an embodiment of a high-gain differential amplifier.

With reference to FIG. 2, an embodiment of the differential amplifier 5 comprises a fourth P-channel MOS transistor 10, whose gate terminal defines the inverting input terminal, and a fifth P-channel MOS transistor 11 whose gate terminal defines the non-inverting terminal. The fourth transistor 10 and the fifth transistor 11 are connected to one another and to a second driven current source 12 by means of the respective source terminals.

The drain terminal of the fourth transistor 10 is connected to the collector terminal of a sixth bipolar NPN transistor 13 and to the gate terminal of the second transistor 2. The drain terminal of the fifth transistor 11 is connected to the anode of a diode 14 and to the base terminal of the sixth transistor 13. The emitter terminal of the sixth transistor 13 is connected to the ground and the cathode of the diode 14 is connected to the ground.

The above described embodiment of the differential amplifier 5, despite being easy to implement, has limited dynamics When the input voltage $V_{in}$ tends to zero and when the load impedance has a low value, in order to make the voltage $V_{out}$ also tend to zero, within the limits of the saturation resistance of the final transistor 2, the second transistor 2 must be in the maximum conduction condition, i.e., the voltage $V_{gs,2}$ must be high. However, in this case the voltage $V_{gs,2}$ can reach at the most circuit illustrated in a value which makes the forth transistor 10 enter the triode region, i.e., $$V_{gs,2,max} = V_{sg,10} + V_T$$

where $V_{sg,10}$ indicates the source-gate voltage of the fourth transistor 10 and $V_T$ its threshold voltage. The value $V_{gs,2,max}$ may thus not be high enough. This problem can be solved by using the circuit illustrated in FIG. 3.

Figure 3:
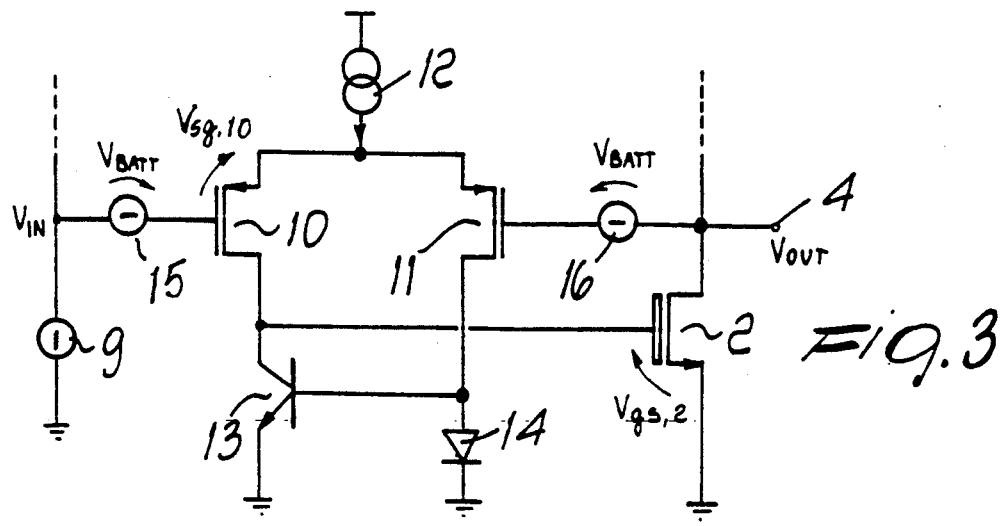
FIG. 3 is a diagram of another embodiment of a high-gain differential amplifier.

With reference to FIG. 3, another embodiment of the differential amplifier 5 comprises the fourth P-channel MOS transistor 10, whose gate terminal is connected to a terminal of a first Voltage source 15, the other terminal of the first voltage source 15 constituting the inverting terminal, and comprises the fifth P-channel MOS transistor 11, whose gate terminal is connected to a terminal of a second voltage source 16; the other terminal of the second voltage source 16 constitutes the non-inverting terminal. The fourth transistor 10 and the fifth transistor 11 are connected to one another and to the second driven current source 12 by means of the respective source terminals.

The drain terminal of the fourth transistor 10 is connected to the collector terminal of the sixth transistor 13 and to the gate terminal of the second transistor 2. The drain terminal of the fifth transistor 11 is connected to the anode of the diode 14 and to the base terminal of the sixth transistor 13. The emitter terminal of the sixth transistor 13 is connected to the ground and the cathode of the diode 14 is connected to the ground.

The maximum value which can be reached by the voltage $V_{gs,2}$ is equal to $V_{in} + V_{sg,10} + V_{batt} + V_T$, where $V_{sg,10}$ is the source-gate voltage of the fourth transistor 10, having $V_T$ as is threshold voltage, batt is the voltage generated by the first voltage source 15. This value can be modified by using the voltage $V_{batt}$ as a degree of freedom. The voltage sources 15 and 16 thus act as true level shifters.

Figure 4:
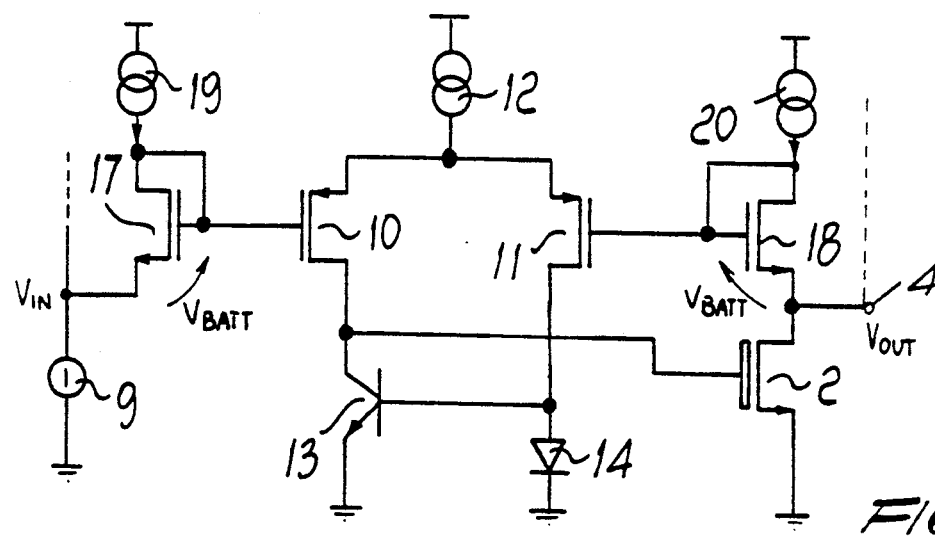
FIG. 4 is a diagram of a further embodiment of a high-gain differential amplifier.

With reference to FIG. 4, the differential amplifier 5 comprises the fourth transistor 10, whose gate terminal is connected to the gate terminal and to the drain terminal of a seventh N-channel MOS transistor 17. The source terminal of the seventh transistor 17 constitutes the non-inverting terminal of the differential amplifier 5. The differential amplifier 5 comprises the fifth P-channel MOS transistor 11, whose gate terminal is connected to the gate terminal and to the drain terminal of an eighth N-channel MOS transistor 18. The source terminal of the eighth transistor 18 constitutes the non-inverting terminal. The fourth and fifth transistors 10 and 11 are connected to one another and to a second driven current source 12 by means of their respective source terminals.

Each of the drain and gate terminals of the seventh transistor 17 and of the eighth transistor 18 is connected to a respective third driven current source 19 and fourth driven current source 20.

The level shifters are illustrated in FIG. 4 in a possible embodiment thereof. The voltage $V_{batt}$ is adjusted by varying the value of the current generated by the third driven current source 19 and by the fourth driven current source 20.

Figure 5:
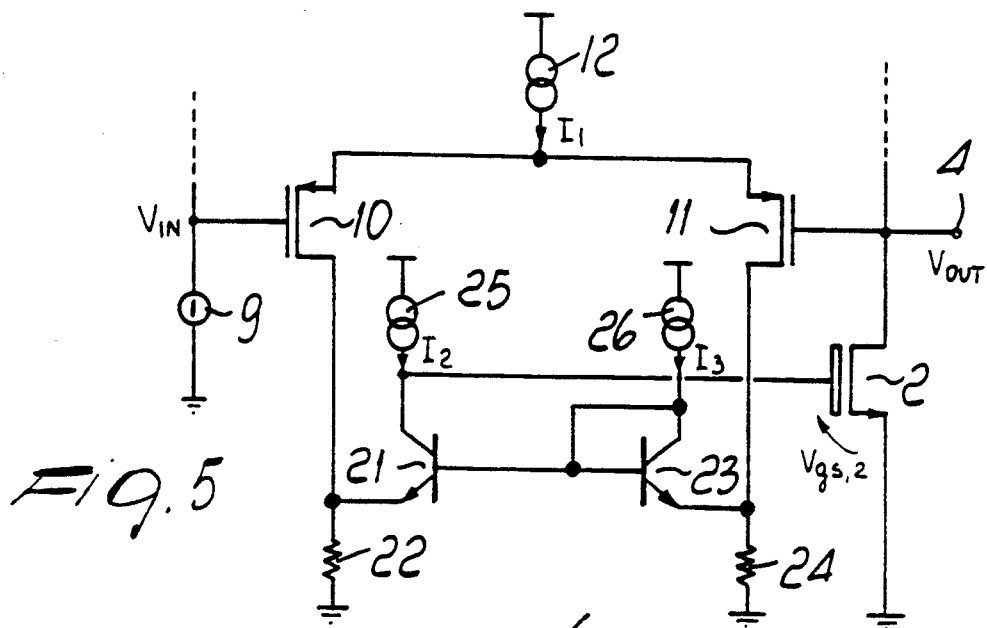
FIG. 5 is a diagram of a final embodiment of a high-gain differential amplifier.

With reference to FIG. 5, which duplicates the general structure described earlier, the drain terminal of the fourth transistor 10 is connected to the emitter terminal of a ninth bipolar NPN transistor 21 and to a first resistor 22 whose other terminal is connected to the ground.

The drain terminal of the fifth transistor 11 is connected to the emitter terminal of a tenth bipolar NPN transistor 23 and to a terminal of a second resistor 24 whose other terminal is connected to the ground.

The collector terminal of the ninth transistor 21 is connected to the gate terminal of the second transistor 2 and to a fifth driven current source 25; the base terminal of the ninth transistor 21 is furthermore connected to the base terminal and to the collector terminal of the tenth transistor 23. These last terminals are connected to a sixth driven current source 26.

The embodiment illustrated in FIG. 5 eliminates the previously described level shifters and poses no upper limit to the level which can be reached by the voltage $V_{gs,2}$ if the resistors 22 and 24 have an appropriate value, together with the currents $I_1$, $I_2$ and $I_3$.

Figure 6:
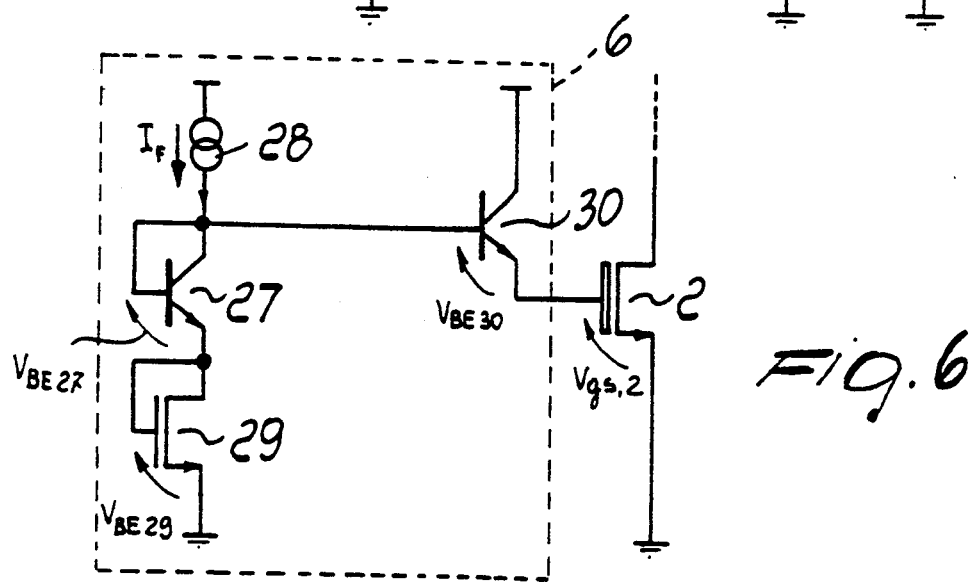
FIG. 6 is a diagram of a leveling circuit.

An embodiment of the leveling circuit is illustrated in FIG. 6, wherein the leveling circuit 6 has an eleventh bipolar NPN transistor 27 whose collector terminal and base terminal are connected to a seventh driven current source 28. The emitter terminal of the eleventh transistor 27 is connected to the drain and gate terminals of a twelfth MOS N-channel transistor 29. The source terminal of the twelfth transistor 29 is connected to the ground.

The base terminal and collector terminal of the eleventh transistor 27 are connected to the base terminal of a thirteenth NPN bipolar transistor 30, whose collector terminal is at the supply voltage 3, and the emitter terminal of the thirteenth transistor 30 is connected to the gate terminal of the second transistor 2.

In the leveling circuit, the voltage $V_{gs,2}$ cannot drop below the value defined by $V_{gs,29} + V_{be,27} - V_{be,30}$, where $V_{gs,29}$ is the gate-source voltage of the twelfth transistor 29 and $V_{be,27}$ and $V_{be,30}$ are the base-emitter voltages of the eleventh transistor 27 and of the thirteenth transistor 30. Said value is approximately equal to $V_{gs,29}$. The value of said limit is in any case set by appropriately choosing the current value Ip generated by the seventh driven current source 28. If the voltage $V_{gs,2}$ drops below the value defined by $V_{gs,29} + V_{be,27} - V_{be,30}$, then the thirteenth transistor 30 switches on, raising the voltage $V_{gs,2}$ to the threshold value defined by the preceding formula.

The present invention advantageously allows a precise control of the bias current and minimizes crossover distortion in a monolithically integratable power amplifier.

The invention conveniently has simple circuital solutions which can be easily executed in integrated form, without resorting to external components, such as the capacitor used in [1] or the potentiometer used in [2].

Finally, the use of components with high current or high bias current values has advantageously been avoided.

The invention thus conceived is susceptible to numerous modifications and variations, all of which are within the scope of the inventive concept. All the details may furthermore be replaced with other technically equivalent elements.

In practice, the materials employed, as well as the dimensions, may be any according to the requirements.

We claim:

1. A unitary-gain final gain stage particularly for a monolithically integratable power amplifier comprising a pair of final MOS power transistors, the first MOS transistor having its drain terminal connected to a first supply voltage, a source terminal connected to a drain terminal of the second MOS transistor having a terminal connected to a second supply voltage, the output terminal of the power amplifier connected between said source terminal of said first MOS transistor and said drain terminal of said second MOS transistor, a high-gain feedback differential amplifier having an inverting input terminal connected to an input of said stage, a non-inverting input terminal connected to said output terminal of said power amplifier and an output terminal connected to the gate terminal of said second MOS transistor, a leveling circuit connected to the gate terminal of said second MOS transistor, said leveling circuit controlling said second MOS transistor, a third MOS transistor having a source terminal connected to the input of the stage, the gate terminal and the drain terminal connected to the gate terminal of said first MOS transistor and to a first driven current source.

2. The final stage according to claim 1, wherein said high-gain feedback differential amplifier comprises a fourth MOS transistor having a gate terminal connected to said inverting input terminal, and a fifth MOS transistor having a gate terminal connected to said non-inverting terminal, said fourth MOS transistor and said fifth MOS transistor being connected to one another and to a second driven current source by means of the respective source terminals.

3. The final stage according to claim 2, wherein the drain terminal of said fourth MOS transistor is connected to the collector terminal of a first bipolar transistor and to the gate terminal of said second MOS transistor, the drain terminal of said fifth MOS transistor being connected to an anode of a diode and to the base terminal of said first bipolar transistor.

4. The final stage according to claim 3, wherein the emitter terminal of said first bipolar transistor is connected to said second supply voltage and a cathode of said diode is connected to said second supply voltage.

5. The final stage according to claim 2, wherein the drain terminal of said fourth MOS transistor is connected to an emitter terminal of a first bipolar transistor and to a first terminal of a first resistor having a second terminal connected to said second supply voltage.

6. The final stage according to claim 5, wherein the drain terminal of said fifth MOS transistor is connected to an emitter terminal of a second bipolar transistor and to a first terminal of a second resistor having a second terminal connected to said second supply voltage.

7. The final stage according to claim 6, wherein the collector terminal of said first bipolar transistor is connected to the gate terminal of said second MOS transistor and to a third driven current source, the base terminal of said first bipolar transistor connected to the base terminal and to the collector terminal of said second bipolar transistor having its base and collector terminal also connected to a fourth driven current source.

8. The final stage according to claim 1, wherein said high-gain feedback differential amplifier comprises a fourth MOS transistor having a gate terminal connected to a first terminal of a first voltage source, a second terminal of said first voltage source connected to said inverting input terminal, and a fifth MOS transistor having a gate terminal connected to a first terminal of a second voltage source, a second terminal of said second voltage source connected to said non-inverting input terminal, said fourth MOS transistor and said fifth MOS transistor connected to one another and to a second driven current source by means of respective source terminals.

9. The final stage according to claim 8, wherein the drain terminal of said fourth MOS transistor is connected to the collector terminal of a first bipolar transistor and to the gate terminal of said second MOS transistor, the drain terminal of said fifth MOS transistor connected to an anode of a diode and to the base terminal of said first bipolar transistor.

10. The final stage according to claim 9, wherein the emitter terminal of said first bipolar transistor is connected to said second supply voltage and a cathode of said diode is connected to said second supply voltage.

11. The final stage according to claim 1, wherein said high-gain feedback differential amplifier comprises a fourth MOS transistor having a gate terminal connected to a gate terminal and to a drain terminal of a sixth MOS transistor, a source terminal of said sixth MOS transistor connected to said inverting input terminal, and a fifth MOS transistor having a gate terminal connected to a gate terminal and to a drain terminal of seventh MOS transistor, a source terminal of said seventh MOS transistor connected to said inverting input terminal, said fourth MOS transistor and said fifth MOS transistor connected to one another and to a second driven current source by means of respective source terminals.

12. The final stage according to claim 11, wherein each of the drain and gate terminals of said sixth and seventh MOS transistors are connected to a respective third and forth driven current sources.

13. The final stage according to claim 1, wherein said leveling circuit has a first bipolar transistor having a collector terminal connected to a second driven current source, an emitter terminal connected to the drain and gate terminals of a fourth MOS transistor having a source terminal connected to said second supply voltage.

14. The final stage according to claim 13, wherein the base terminal of said first bipolar transistor is connected to the base terminal of a second bipolar transistor having a collector terminal connected to said first supply voltage, an emitter terminal connected to the gate terminal of said second MOS transistor.

* * * * *

UNITED STATES PATENT AND TRADEMARK OFFICE
CERTIFICATE OF CORRECTION

PATENT NO. : 5,216,381
DATED : June 1, 1993
INVENTOR(S) : Edoardo Botti et al.

It is certified that error appears in the above-indentified patent and that said Letters Patent is hereby corrected as shown below:

On the title page, item [73] Assignee:, please delete "SGS-Thomson Microelectronics, S.r.l., Italy" and replace with --SGS-Thomson Microelectronics, S.r.l., 20041 Agrate Brianza (Prov. of Milan), Italy--

Signed and Sealed this

Eighth Day of March, 1994

*Attest:*

BRUCE LEHMAN

*Attesting Officer*  *Commissioner of Patents and Trademarks*